United States Patent [19]

Borer

[11] 3,944,920

[45] Mar. 16, 1976

[54] CURRENT MEASUREMENT

[75] Inventor: Alan John Borer, Crowborough, England

[73] Assignee: Taylor Servomex Limited, Crowborough, England

[22] Filed: Aug. 7, 1974

[21] Appl. No.: 495,414

Related U.S. Application Data

[63] Continuation of Ser. No. 334,414, Feb. 21, 1973, abandoned.

[30] Foreign Application Priority Data

Feb. 22, 1972 United Kingdom.............. 8102/72

[52] U.S. Cl. ............... 324/111; 324/130; 328/162
[51] Int. Cl.² ...................... G01R 1/02; G01R 1/00
[58] Field of Search ........... 324/111, 119, 102, 130; 328/127, 162, 164

[56] References Cited

UNITED STATES PATENTS

| 3,205,347 | 9/1965 | Wright | 324/119 |
| 3,350,574 | 10/1967 | James | 328/127 |
| 3,584,294 | 6/1971 | Siwko | 324/111 |
| 3,610,952 | 10/1971 | Chandos | 328/127 |

*Primary Examiner*—R. V. Rolinec
*Assistant Examiner*—Ernest F. Karlsen
*Attorney, Agent, or Firm*—Scrivener Parker Scrivener and Clarke

[57] ABSTRACT

An apparatus for measuring small currents in which the current is applied to an integrator. The integrator output is applied to a slope detecting means, preferably differentiator and the integrator output is reduced at intervals to zero.

5 Claims, 17 Drawing Figures

$V_{OUT} = I_{IN} R_{13} \frac{C_9}{C_{10}}$

TIME

CURRENT MEASUREMENT

This is a continuation of application Ser. No. 334,414 filed Feb. 21, 1973, now abandoned.

BACKGROUND OF THE INVENTION

This invention relates to apparatus for the measurement of electric current, and other variables which can be related to, or expressed in terms of a current. While of general applications, the invention is of particular advantage in the measurement of very small current. For the purpose of this specification, measurement is to be taken as including the production of an output variable which is directly proportional to an input current whether or not that output variable is calibrated or indicated directly in current units. The invention can also be used for indication, measurement or control of variables in response to current changes, and to the establishment of currents of known or desired magnitudes.

THE PRIOR ART

One method of measuring electric currents, which is applicable to a wide range of current values, is by means of an integrator. The current is applied to the integrator, and after a period of time the value of the integrated current is examined, and the current value can be determined from the result of such examination. For example, the integrated current can be permitted to reach a predetermined value and the average current is then a function of the time taken to reach that value. Alternatively, the average current is a function of the time taken to reduce the integrated current to zero, with a reference current.

THE INVENTION

With the invention, currents, and especially very small currents which may be of the order of a few picoamps, can be indicated by integrating the current, and applying the integrated current to a differentiator. The desired indication is preferably obtained from the differentiator output, with means for periodically reducing the integrator output to zero, but the output can also be obtained from the integrator and the differentiator output being fed back to offset the input and maintain a substantially constant input signal at the input.

The present invention has for its object to provide an improved apparatus of this kind permitting very low values of current to be indicated with high accuracy.

The invention includes an apparatus for measuring or indicating the value of a small input current, comprising an integrator, means for applying said current to said integrator, slope detection means responsive to the output of the integrator to produce an apparatus output signal representing the value of the input signal and means for periodically resetting the integrator output.

THE DRAWINGS

Features and advantages of the invention will appear from the following description of embodiments thereof, given by way of example, in conjunction with the accompanying drawings in which.

Figure 12A:
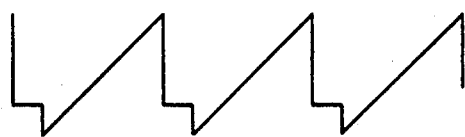
Figure 12B:
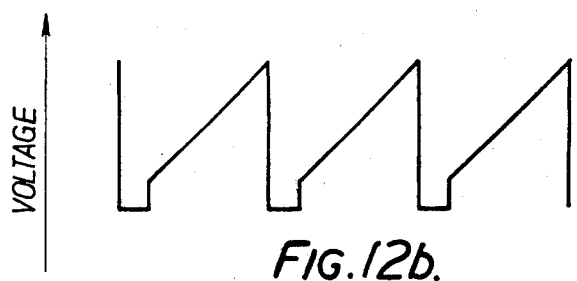
Figure 12C:
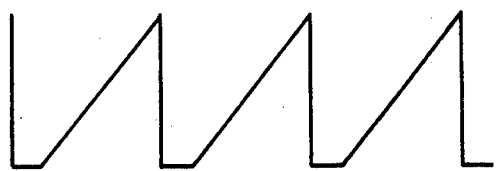
Figure 13:
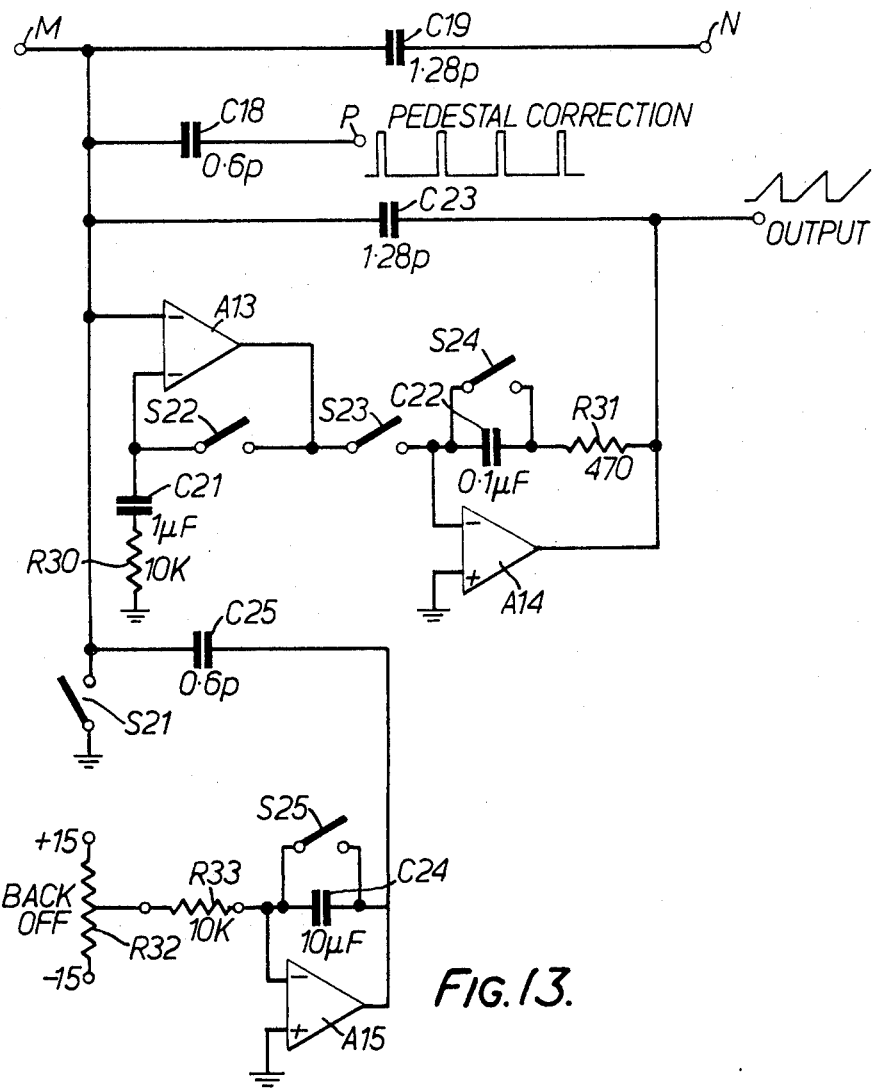
Figure 14:
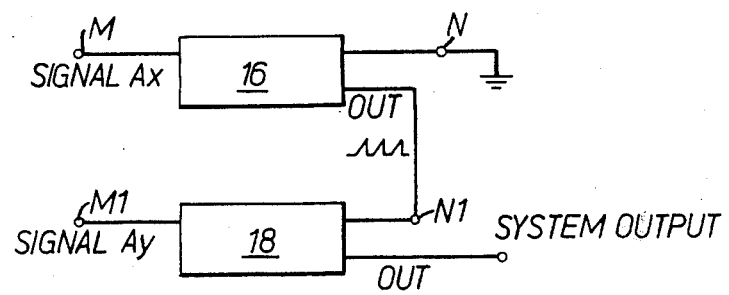

FIG. 12 A–C is a waveform diagram;

FIG. 13 is a more detailed circuit diagram of one unit of a difference responsive system;

FIG. 14 is a block diagram of a current difference responsive system; and

Figure 15:
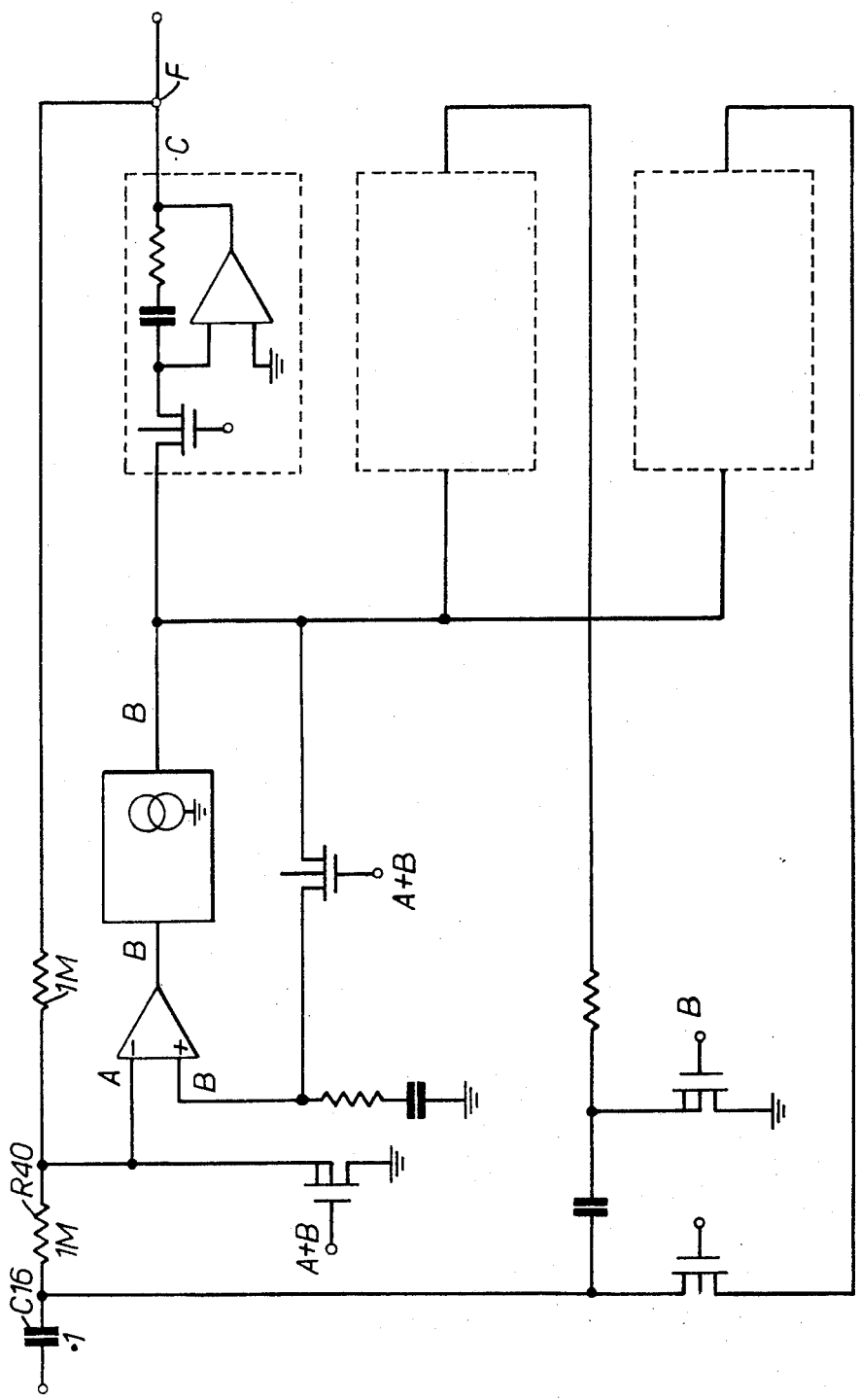

FIG. 15 is a diagram of another form of differentiator.

Figure 1:
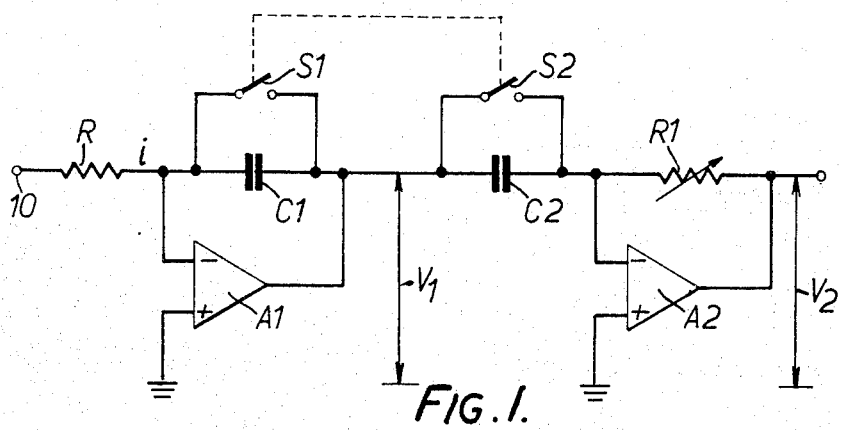
FIGS. 1, 2, 3 and 4 are fragmentary circuit diagrams of current responsive means.

FIG. 1 shows an arrangement comprising an amplifier A1 of the so-called operational amplifier type, of high gain, from zero frequency upwards, with inverting inputs and non-inverting inputs − and + respectively. An input current $i$ to be measured, appearing at terminal 10, is applied to the inverting input of amplifier A1 through a resistor R. A capacitor C1 is connected between output and inverting input of the amplifier, to given an integrating function. The capacitor can be discharged by switch S1.

The output voltage V1 of amplifier A1 is applied to a further and similar amplifier A2 which with input capacitor C2 and feedback resistor R1, shown as variable, functions as a differentiator. Capacitor C2 is shunted by switch S2 which can be ganged with S1, as shown.

The output voltage v1 of amplifier A1 will be given by $$V1 = 1/C1 \int i \cdot dt \qquad (1)$$

and V2 will be given by $$V2 = R1\, C2\, d(V1)/dt \qquad (2)$$

$$\text{Hence } V2 = -R1\, C2\, \frac{d\left(\frac{1}{C1}\int i\, dt\right)}{dt}$$

$$= -(C2R1/C1) \qquad (3)$$

By this means it is possible to measure a current the magnitude of which is determinable by the voltage V2.

The integration cannot continue indefinitely, and switches S1 and S2, periodically operated, are provided to restart cycles of operation. In a practical case the switches might operate at a switching rate of 10 Hz; when the switches are open, a continuous current is obtained, and if the discontinuity occasioned by closing the switches can be ignored, and the switches need be closed for only a very short time in each cycle, this is useful in certain conditions.

Figure 2:
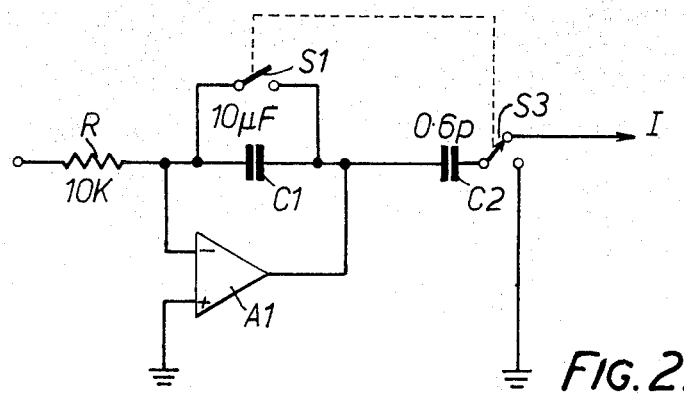

Alternatively, an arrangement as shown in FIG. 2 can be used in which the voltage V1 is applied through a capacitor C2, to a switch S3, ganged with switch S1, either to the output, or to ground. This arrangement gives an output which is continuous while switch S1 is open and zero when the switch is closed.

Figure 3:
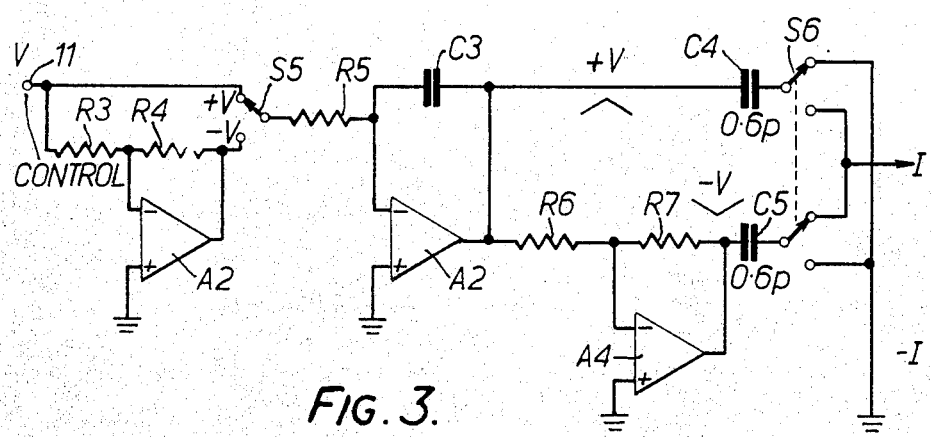

With a resetting frequency of 10 Hz. the closure time of the switches S1 and S3 might be 1 millisecond, that is, providing a mark:space ratio of 99:1 for integration, but other ratios can be used, and FIG. 3 shows an arrangement for producing a continuous current with effectively at 1:1 mark:space ratio.

In FIG. 3 the input direct voltage at terminal 11 is applied to a stage comprising amplifier A2 with a feedback path to the inverting input determined by resistors R3 and R4, so as to enable two outputs +v and —v to be obtained. These are selectable by switch S5, applied to the integrator R5, A3, C3, the output of which will accordingly be a triangular type waveform. This waveform is fed through capacitor C4 directly to switch S6, and through the inverter R6, R7, A4 and capacitor C5 to switch S6. By combining the outputs a continuous output current can be obtained.

Figure 4:
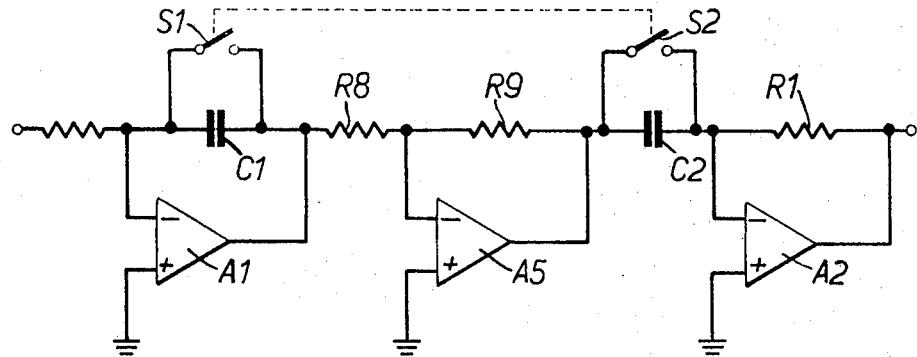

The circuit of FIG. 1 can be modified in various other ways. For example, it may be convenient to use an intermediate controllable attenuator stage as in FIG. 4. The output voltage V1 of amplifier A1 is applied to a stage including input resistor R8, amplifier A5, and variable feedback resistor R9. With this arrangement, the gain of the intermediate stage will be the ratio (R9/R8) and V2 will be given by:

$$V2 = (i\ R1\ C2\ R9) / (C1\ R8) \quad (4)$$

Figure 5:
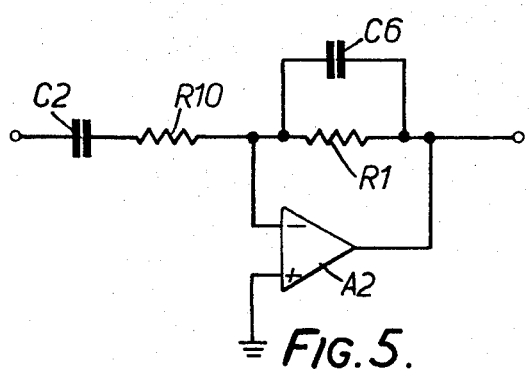
FIG. 5 is a circuit diagram of a differentiating means.

To avoid malfunctioning due to noise or interference, a more practical form of differentiator is shown in FIG. 5 in which the feedback resistor R1 is shunted by a small capacitor C6, and input capacitor C2 has in series with it a resistor R10.

With constant input, the output voltage V1 of FIG. 1 will consist of a series of voltage ramps, the slope of which is a function of the input current. The voltage change which takes place in a given time interval during the period of the ramp can also be used as an indication of the input current.

In some circumstances where it is desired to measure very small currents it occurs that the current input contains two components, one of which is constant or is subject to long term, or relatively long term variations only whilst a more significant componnent is subject to more rapid variations. In such conditions, it is possible to use an arrangement for backing off the first component by means of a large value resistor between output and input of the circuit, though this has certain disadvantages.

Figure 6:
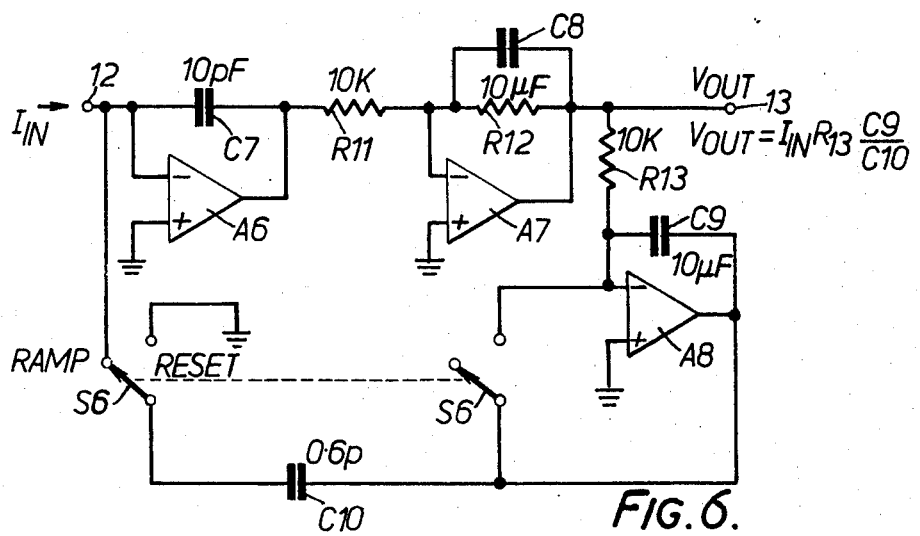
FIG. 6 is a circuit diagram of an integrator-differentiator arrangement.

A possible arrangement of integrator-differentiator circuit is shown in FIG. 6. In this Figure the input at 12 is applied to the inverting input of amplifier A6, which has a negative feedback capacitor C7. The output of the amplifier is applied to a gain stage R11, R12, C8 and A7.

The output of the gain stage, at terminal 13 is fed back to the input 12 over a feedback path including an integrator R13, C9, A8, which, being in the feedback path will function as a differentiator. Switch S6 is provided; in one position of the switch, the ramp position, the feedback path is completed through capacitor C10, whilst in the other position of the switch, the reset position, the integrator is disabled an C10 is connected to earth. The circiut of FIG. 6 can also be adapted to use a current generator of the type shown in FIG. 3, rather than one of the type of FIG. 2. It may be remarked that current generators of the types shown in FIGS. 2 and 3 can be used to supply the gate leakage bias current of conventional junction F.E.T. electrometers and the like, in place of high value resistors as are usual.

Other methods can be adopted, in conjunction with an input current integrator, to determine the rate of change of output of the integrator and hence the value of input current. For example, there are many methods by which the output waveform can in effect, be sampled at discrete times, and the slope of the curve determined directly or indirectly.

Figure 7:
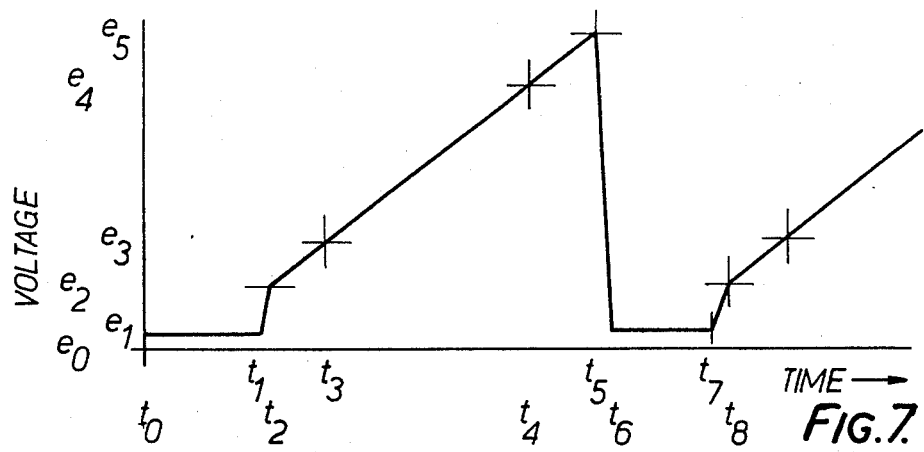
FIG. 7 is a waveform diagram.

FIG. 7 is one example of an output voltage waveform such as might be obtained from the integrator. With constant current input over the integration time, which may be, for example, a few milliseconds or tens of milliseconds, the waveform may exhibit from time $t_0$ to $t_1$ a voltage level e1; at time $t_1$ to $t_2$ a voltage step from $e_1$ to $e_2$; over the time $t_2$, $t_3$, $t_4$ to $t_5$ the linear voltage rise use through values $e_2$, $e_3$, $e_4$, $e_5$; at time $t_5$ to $t_6$ a drop from $e_5$ to $e_6$ (which may be the same as $e_1$) and the cycle of voltage is repeated with values $e_7$ $e_8$ $e_9$ at times $t_7$ $t_8$ $t_9$ and so on. Times $t1$ to $t2$ and $t5$ to $t6$ will be very short.

The slope of the integration curve can be determined by sampling and deriving the difference voltages:

$e_5 \sim e_7$
$e_4 \sim e_8$
$e_5 \sim e_8$
$e_4 \sim e_7$ or less accurately:

$e_5 \sim e_6$
$e_5 \sim e_0$
$e_5 \sim e_2$
$e_5 \sim e_3$
$e_5 \sim e_1$
$e_4 \sim e_6$
$e_4 \sim e_0$
$e_4 \sim e_3$
$e_4 \sim e_2$
$e_4 \sim e_1$ In practical forms of the apparatus described, one difficulty that arises is due to the fact that the means adopted to examine or otherwise respond to the integrator voltage or other voltages which are significant voltages existing in high or extremely high impedance circuits, will cause an undesired change in the voltage under examination. For example, in using a switching device, such as an insulated gate field effect transistor the transistor itself may present an input capacitance which though extremely small may be significant.

Figure 8:
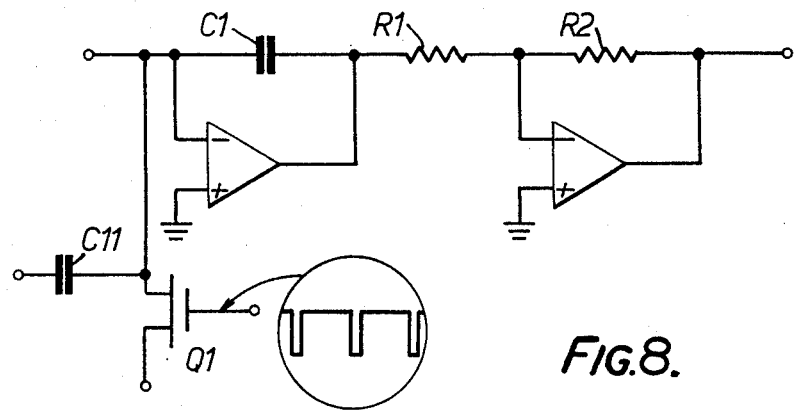
FIG. 8 is a diagram of a switching arrangement.
Figure 9:
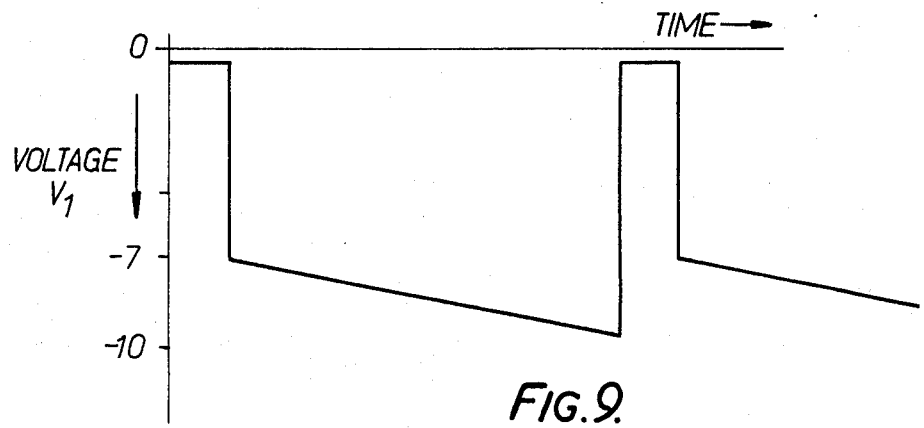
FIG. 9 is a waveform diagram pertaining to FIG. 8.

The difficulty is illustrated by the example shown in FIGS. 8 and 9. FIG. 8 shows the circuit including integrator $A_1$, $C_1$, with an associated switching transistor $Q_1$, corresponding to switch S1 above. A control signal is applied to the gate of this transistor Q1 as indicated by the waveform W1. The switching pulse in practice might have an amplitude of −10V.

When the pulse occurs the switch Q1 closes and capacitor C1 is discharged. The output voltage drops to a value close to zero, and the switch then opens to restart the measuring cycle of integration. If C1 is 1pf and the closed switch has a capacitance of, say, 0.7 pf a pulse of −7 volts is produced at the integrator output as shown in FIG. 9. The integration cycle continues for the set period, say 100 milliseconds, and the cycle is repeated.

This effect can be overcome by applying to the significant point of the circuit a compensation pulse of opposite polarity, through a corresponding capacitance C11. The capacitor can be equal to the switch capacitance, such as 0.7 pf in the example given, and applying the appropriate control signal voltage, of opposite polarity, to this capacitor.

It can be arranged that in preference to being preset the compensation pulse amplitude is automatically controlled so as precisely to eliminate the undesired voltage pedestal.

In another method of dealing with this difficulty an appropriate bias can be provided to remove the pedestal during the integration period; this produces a very high voltage output during the reset period, but the effects of this can be reduced by simultaneously switching the resistor R2 of FIG. 8. The difficulty is also overcome with the use of switching means, such as a reed relay switch which does not transfer charge, or a photo-resistive chopper device.

Figure 10:
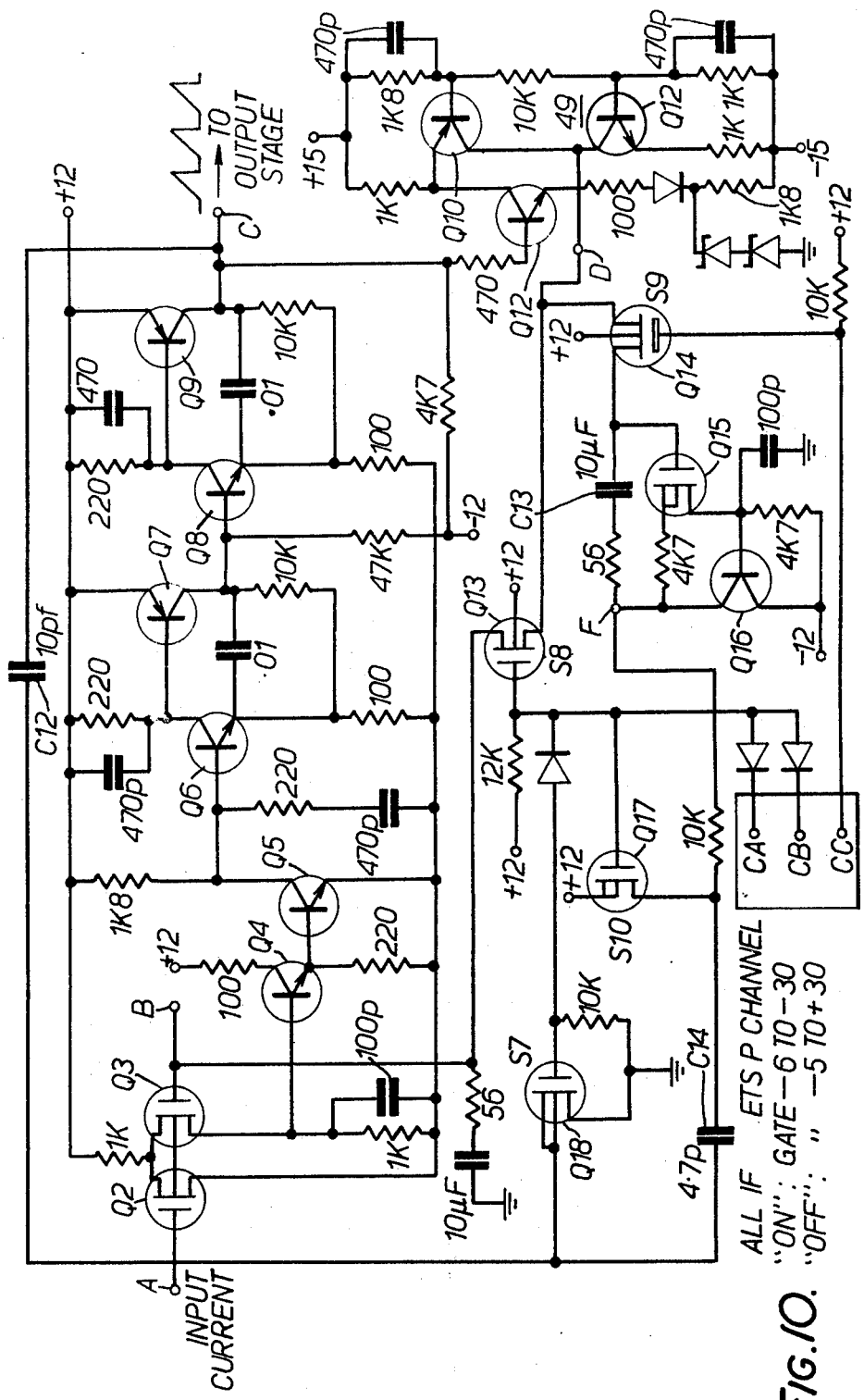
FIG. 10 is a more detailed circuit diagram.
Figure 11:
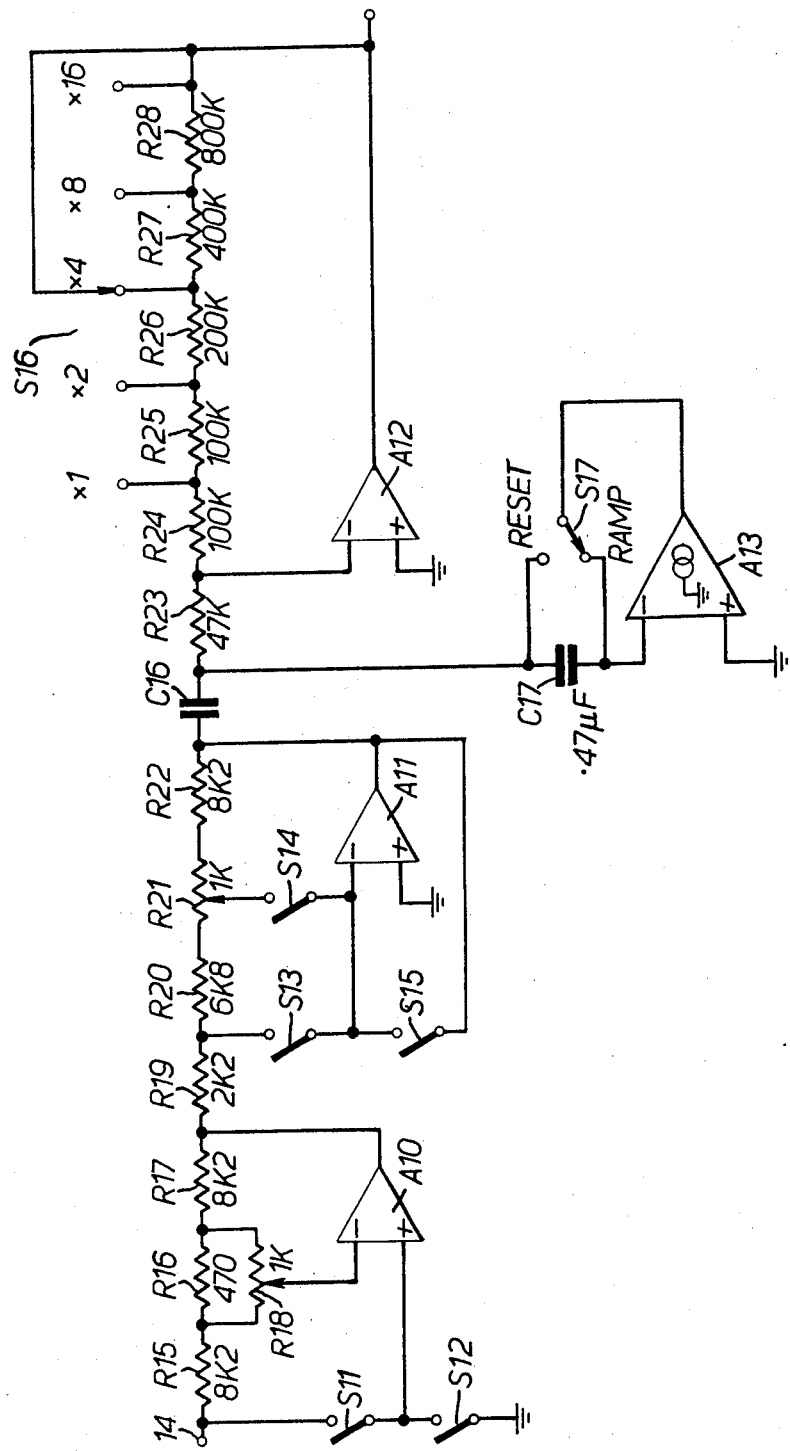
FIG. 11 is a block diagram of a circuit which with FIG. 10 gives a complete arrangement.

A form of the invention, with circuit component values, is shown in FIGS. 10 and 11. The amplifier in the upper part of the FIG. 10 and including transistors Q1 to Q9 has an inverting input A and non-inverting input B and produces an output at C. This output C drives the main feedback capacitor C12 connected back to input A. The output as C is fed to means for further amplification and differentiation. The output at C is also fed to an amplifier indicated generally at A9 including transistors Q10, Q11 and Q12, which has a constant current type output at terminal D. Four switches S7, S8, S9 and S10, consisting of insulated gate F.E.T.'s are provided; during the reset period switch S7 shorts the input A to earth and switch S8 is closed connecting terminal D to the non-inverting input B of the amplifier. The appropriate control voltages are applied at CA, CB, CC.

At the end of the reset period, switches S7 and S8 are opened leaving the amplifier in the balanced condition, and terminal D is then connected through switch S9 to a further integrator. If the control voltage applied to switch S7 has capacitively disturbed the balance of the amplifier then the output will alter, producing a current at D, and that current will flow through switch S9 into the integrator, changing the output voltage at F. During the reset period the switch S10 connected to the positive supply rail +12, is closed and at the end of the reset period, when S7 opens S10 is also opened, and it is arranged that the voltage change through capacitor C14 will neutralize the volatage change due to the gate S7. If the neutralizing is not complete, there may be a further improvement from the output of constant current source A9 and through switch S9 into the integrator.

With the component values of FIG. 10 it is considered that further detailed description is not necessary.

A differentiator is shown in FIG. 11. The ramp type input is applied to terminal 14, and fed through switch S11 to the non-inverting input of amplifier A10, which has an adjustable feedback including R15, R16, R17, R18. The same amplifier input can be shorted to ground through switch S12. The amplifier output is fed to a variable attenuator stage including amplifier A11, resistors R19, R20, R21 and R22, and switches S13, S14 and S15.

The differentiator includes an input capacitor C16, amplifier A12 with input resistor R23 and selectable feedback resistors R24 to R28, and selector switch S16. The input is applied also to amplifier A13; a capacitor C17 can be switched by S17 to serve as an input capacitor during a ramp signal input and as a feeback capacitor during reset.

Another form of integrator is shown in FIG. 13. The circuit has inputs M and N; the signal to be integrated is applied to input M. A pedestal correction voltage can be applied at input P, through capacitor C18.

The input at M is fed to the non-inverting input of amplifier A13; the inverting input is connected to ground through C21 and R30. The amplifier input is switched by S21 and the output, switched by S22, S23 is applied to amplifier A14, which has inverting feedback through R31 and C22 switched by S24. The feedback capacitor is C23.

The input at M is also connected to a backing off arrangement. Voltage from a back-off potentiometer R32 is applied to a ramp generator R33, C24, A15, switched by S25, the ramp voltage being fed through capacitor C25.

The measurement cycle of the instrument is as follows:

| Operation | Duration | S21 | S22 | S23 | S24 | S25 |
| --- | --- | --- | --- | --- | --- | --- |
| Reset | .001 sec | ON | ON | OFF | ON | ON |
| Ramp | .099 sec | OFF | OFF | ON | OFF | OFF |
| Reset | .001 sec | ON | ON | OFF | ON | ON |
| Ramp | .099 sec | OFF | OFF | ON and so on. | OFF | OFF |

In response to a signal current to be measured applied to input M, the output N provides a ramp waveform which is subsequently amplified and differentiated with a suitable system such as FIG. 11, in which the differentiation capacitor is periodically reset with a switch system in synchronisation with the resetting of the system of FIG. 13.

During reset, the output is at zero (or a reference potential corresponding to zero) and S21 is shorted to ground. The output of A13 is zero or a reference potential.

At the end of reset the I.G.F.E.T. switch S21 is turned off by the gate potential being raised from −15V to OV. The capacitive coupling within the I.G.F.E.T. result in a transfer of charge into the measurement circuitry. A similar voltage waveform of opposite polarity is applied to capacitor C18, and if the amplitude is precisely adjusted then the consequent transfer of charge into the measurement circuitry will exactly counterbalance that due to the I.G.F.E.T. capacitance. If the adjustment is not perfect then the residual charge will be supplied through capacitor C23 resulting in a pedestal, giving waveforms such as those shown in FIGS. 12a or 12b, instead of the desired waveform shown in FIG. 12c.

During the ramp period the backing-off ramp generator A15 applies a ramp waveform to C25 resulting in a backing-off current flowing through C25 into the measurement circuitry. This current is added to the input signal current and the total current flows through C23 under the control of amplifiers A13 and A14. Hence the output waveform is a ramp whose rate is proportional to the input current and the backing-off current. The backing-off control can also be used to neutralise any detector standing current such as that due to d.c. bias in the signal.

After the ramp period, a further period occurs, in which the various capacitors are reset to the voltages described earlier. It is to be noted that the changes in the voltages across the capacitors results in changes in the stored charge of each capacitor. The total change of charge of C23, C18, C25 and C19 results in a movement of charge through switch S21.

Switch S22 and C21 are used to re-zero the amplifier A13 whilst the integrator capacitors are being reset. An alternative system, avoiding the use of S22 and C21, employs an ideal amplifier which requires no automatic zero control to yield conditions of zero input current and voltage but suitable devices, for example vibrating capacitor electrometers, are more expensive.

If the difference between two input signals Ax and Ay is required, two similar units 16 and 18 are used as in FIG. 14. Signal Ax is applied to input M of unit 16, which produces a corresponding ramp output waveform at its output. The second input N of unit 16 is connectable to earth.

The second signal Ay is applied to the first input $M_1$ of unit 18, to the second input $N_1$ of which is applied the output from unit 16 as shown. The desired output is obtained from the output of unit 18.

By way of example, if the input Ax to unit 16 is 64pA, the output of unit 16 might change by 5 volts in 0.1 secs. which will be applied to the 'N' input of unit 18, and this results in 64pA flowing through C19 into the input of A13. If the input Ay to unit 18 is, say, 80pA then there will be a net difference of (80–64), or 16pA, giving an output from 18 of 1.25 volts in 0.1 sec.

The output is amplified, inverted or non-inverted, as selected, differentiated/reset, amplified, or displayed on a recorder, as may be desired. The two stages of amplification are controlled so that gain may be precisely selected; in one case, binary steps from 1 to 128 i.e., 1, 2, 4, 8, 16, 32, 64, 128 were provided.

With C19 equal to $1.28p^F$ the f.s.d. sensitivity of this instrument was selected in binary steps from 128pA to 1pA, i.e.,

| f.s.d. | pA | 1 | 2 | 4 | 8 | 16 | 32 | 64 | 128 |
|---|---|---|---|---|---|---|---|---|---|
| G | | 128 | 64 | 32 | 16 | 8 | 4 | 2 | 1 |

For larger values of current the capacitor can be switched, for example to 163.84pF (256pA on X64 and 16384pA on XI): or 20971.52pF (32768pA on X64 and 2097152pA on XI).

Similarly, capacitor C25 is switched from 0.6pF to 10pF, 150pF or 2400pF for larger values of backing off current.

The circuit of either FIG. 2 or FIG. 3 can be used in place of that part of the circuit comprising A15 and the associated components, for injecting the current.

For the 20971.52pF capacitor it is convenient to use a capacitor of about $0.022\mu F$ and a pre-set trimmer potentiometer to attenuate the voltage feedback to the capacitor so that the net effect is about 20971.52pF. All the important capacitors can be adjusted by this means.

The amplifier A13 has a high impedance output, corresponding to a constant current source and gave a $40\mu A$ charge for each 1mV input over the frequency range from 0 to 5kHz, whereafter it reduced by 20dB per decade to $0.1\mu A/mV$ at 2MHz with unity gain at this frequency during reset.

The amplifier A13 was 25 times more sensitive to its non-inverting input at all frequencies, and since the amplifier A14 characteristics are controlled by R31 and C22 the unity loop gain frequency during the ramp period was also 2MHz.

In the instruments described, the design has been directed to one having a frequency response of 0 to 1 Hz, with a switching frequency of 10 Hz but other frequencies can be used. It is found that with a sinusoidal input at 1 Hz, the differentiator output is sinusoidal; the integrator output is cosinusoidal.

It will be seen that in the manner described, it is possible to generate very small known currents, and to measure small currents by a process of integration and differentiation, with automatic cycling if this is desired. The integrated ramp voltage can be examined, as to rate of change by other methods, as described or by analogue to digital conversion, with digital examination, including sample and hold techniques.

It is also possible, as described to provide for automatic zeroing of the system input, so that even if the comparison amplifier input drifts, the potential difference between say the signal current input conductor and any earthing screen used can be kept constant at a low value, as will the potential across the reset switches.

The means of neutralising the effect of capacitor charges upon switching is also advantageous.

FIG. 15 is a differentiator circuit which can be used as an alternative to the right hand part of FIG. 11. Resistor R40 like R23 in FIG. 11, is included to give a desired frequency response. The units within the dotted rectangles are similar. With the arrangement of FIG. 15, a full scale charge of about 10 $\mu A$ can be obtained for an input which might charge by up to 10 volts in 100 milliseconds; with a feedback resistor 1 M.ohm an output of 10 volts will be obtained at terminal F.

In FIG. 11 a current of $100\mu A$ being injected through C16 and into the amplifier, with a feedback resistance of 100 K ohms, for an output of 10 volts.

One possible source of inaccuracy in a system such as that described is a distortion due to dielectric absorption, for example in insulated gate F.E.T. switch. To avoid this inaccuracy it is possible to make a compensating distortion change in the correction voltage or the drive voltage, or both. A suitable compensating distortion is to use a true square wave drive voltage to the switch, with a square wave with 'droop' used for correction, or to use a square wave for correction, with a square wave with overdrive for driving the switch; combinations of these two corrections can also be used.

I claim:

1. An apparatus responding to the value of a small input current, comprising input terminals for said input current and output terminals, and an integrator, said integrator having an integrator input coupled to said input terminals, and an output, said integrator comprising an amplifier connected in a path between input and output of said integrator and a capacitor, whereby said integrator produces on said capacitor a voltage which is the continuing integral of an input current applied to said input terminals, said apparatus further comprising a differentiator having an input coupled to the integrator output and an output, to differentiate continuously the voltage at the integrator output whilst the voltage at said integrator output is varying, and an output coupled to said output terminals whereby an output is obtained at said output terminals which is directly proportional to said input current, said apparatus further including switching means associated with the input to said integrator, said switching means being of a nature to produce by its operation an unwanted input to said integrator and comprising means for developing a correction signal the effect of which is equal and opposite that of said unwanted signal, and, on operation of said switching means injecting said correction signal into said input.

2. An apparatus in accordance with claim 1, wherein said switching means is a field effect transistor, and said unwanted signal is due to a capacitance of said transistor, and wherein the means for developing said correction signal includes a capacitor and further switching means for injecting into said injector input a current due to a change of charge on said capacitor.

3. An apparatus in accordance with claim 1, and including a feedback path from an output of said integrator to the input of said integrator, said feedback path including a second integrator whereby said second integrator is effective to produce at said first integrator input a signal component, applied in opposition to the input current to be measured, the loop circuit including both said integrators having gain, whereby the input to the first integrator tends to remain substantially constant, the output from said apparatus being derived from the output of said first integrator.

4. An apparatus in accordance with claim 1 and including means for injecting a steady bias current into the input of said integrator.

5. An apparatus in accordance with claim 1 and including means for deriving from the input current an inverse current of equal amplitude and opposite polarity, said switching means alternately applying the input and inverse currents to said integrator means, a phase inverter connection to the output of said integrator and selecting means for selectig the signal at the input or output of said phase inverter.

* * * * *